United States Patent
Nayak et al.

(10) Patent No.: US 11,687,132 B2
(45) Date of Patent: Jun. 27, 2023

(54) CROSSFLOW AIR DEFLECTOR FOR HIGH DENSITY INDEPENDENT AIRFLOW CONTROL

(71) Applicant: Western Digital Technologies, Inc., San Jose, CA (US)

(72) Inventors: Shailesh R Nayak, Bangalore (IN); Joe Paul Moolanmoozha, Bangalore (IN); Steven Cheng, Sunnyvale, CA (US); Erik Silaprasay, San Jose, CA (US); Nicholas Maris, Union City, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/858,754

(22) Filed: Jul. 6, 2022

(65) Prior Publication Data
US 2022/0350379 A1    Nov. 3, 2022

Related U.S. Application Data

(62) Division of application No. 17/177,163, filed on Feb. 16, 2021, now Pat. No. 11,402,884.
(Continued)

(51) Int. Cl.
*G06F 1/20* (2006.01)
*G05B 19/404* (2006.01)
*H05K 7/20* (2006.01)

(52) U.S. Cl.
CPC .............. *G06F 1/20* (2013.01); *G05B 19/404* (2013.01); *H05K 7/20145* (2013.01); *G05B 2219/49219* (2013.01)

(58) Field of Classification Search
CPC . G06F 1/20; G06F 1/181; G06F 1/206; G06F 1/187; G06F 2200/201;
(Continued)

(56) References Cited

U.S. PATENT DOCUMENTS

| 7,495,906 B2 | 2/2009 | Fujie et al. |
| 7,778,031 B1 | 8/2010 | Merrow et al. |

(Continued)

OTHER PUBLICATIONS

Igor Wallessek, Airflow: Hard Drive Cooling, Nov. 8, 2011, 7 pages, Future US, downloaded at https://www.tomshardware.com/reviews/cooling-airflow-heatsink,3053-9.html.
(Continued)

*Primary Examiner* — Mandeep S Buttar
(74) *Attorney, Agent, or Firm* — John D. Henkhaus

(57) ABSTRACT

A crossflow air deflector part for directing airflow includes a front central spine, a first arcuate wall extending from the spine to a first back lateral edge of the airflow deflector, and a second arcuate wall extending from the spine to a second back lateral edge of the airflow deflector opposing the first back lateral edge. Such an airflow deflector can be implemented into a storage server, positioned between a laterally adjacent pair of data storage device (DSD) chambers and a pair of vertically stacked fans, such that the crossflow air deflector functions to direct airflow from one of the lateral DSD chambers into the lower fan and to direct airflow from the other lateral DSD chamber into the upper fan. Independent airflow control for each DSD chamber and each corresponding DSD is thereby provided.

13 Claims, 8 Drawing Sheets

Related U.S. Application Data

(60) Provisional application No. 63/144,247, filed on Feb. 1, 2021.

(58) Field of Classification Search
CPC .......... H05K 7/20145; H05K 7/20172; H05K 7/20581; H05K 7/20727; G11B 33/142; G11B 33/128; G11B 33/00
USPC .... 361/695, 679.46, 679.33, 679.48, 679.49, 361/679.51, 678, 679.5, 690
See application file for complete search history.

(56) References Cited

U.S. PATENT DOCUMENTS

| | | | |
|---|---|---|---|
| 8,687,356 B2 | 4/2014 | Merrow | |
| 10,026,454 B2 | 7/2018 | Davis et al. | |
| 10,908,657 B2* | 2/2021 | Odisho | ................. H05K 7/205 |
| 11,129,296 B2* | 9/2021 | Chen | ................. H05K 7/20727 |
| 2008/0265125 A1 | 10/2008 | Ye et al. | |
| 2009/0016019 A1 | 1/2009 | Bandholz et al. | |
| 2011/0290894 A1 | 12/2011 | Dufresne, II et al. | |
| 2014/0146462 A1 | 5/2014 | Coglitore | |
| 2016/0363972 A1* | 12/2016 | McNally | ................. G06F 1/206 |
| 2017/0038802 A1 | 2/2017 | Kwon et al. | |
| 2017/0215300 A1* | 7/2017 | Salmond | ............ H05K 7/20172 |
| 2018/0359882 A1* | 12/2018 | Lovicott | ............ H05K 7/20727 |

OTHER PUBLICATIONS

Israel Patent Office (ISA/IL), PCT International Search Report and Written Opinion for counterpart International application No. PCT/US2021/037953, Oct. 14, 2021, 8 pages.

* cited by examiner

CROSSFLOW AIR DEFLECTOR FOR HIGH DENSITY INDEPENDENT AIRFLOW CONTROL

CROSS-REFERENCE TO RELATED APPLICATIONS

This application is a divisional of and claims the benefit of priority to U.S. patent application Ser. No. 17/177,163, filed Feb. 16, 2021, which claims the benefit of priority to U.S. Provisional Patent Application No. 63/144,247, filed Feb. 1, 2021, the entire content of all of which is incorporated by reference for all purposes as if fully set forth herein.

FIELD OF EMBODIMENTS

Embodiments of the invention may relate generally to electronics cooling, and particularly to a crossflow air deflector for independent airflow control.

BACKGROUND

As networked computer systems grow in numbers and capability, there is a need for more storage system capacity. Cloud computing and large-scale data processing further increase the need for digital data storage systems that are capable of transferring and holding significant amounts of data. Data centers typically include many rack-mountable storage units that are used to store the large amounts of data.

One approach to providing sufficient data storage in datacenters is the use of arrays of data storage devices. Many data storage devices can be housed in an electronics enclosure (sometimes referred to as a "rack"), which is typically a modular unit that can hold and operate independent data storage devices in an array, computer processors, routers and other electronic equipment. The data storage devices are often mounted in close proximity to each other within the electronics enclosure, i.e., densely packed or "high-density" systems, so that many data storage devices can fit into a defined volume. Operating many data storage devices within close proximity within the electronics enclosure can create heat issues, which can in turn lead to premature failure of the data storage devices. Rack systems typically include fans or other cooling devices. Thus, with rack-mounted devices that utilize forced air convection for cooling, controlling the airflow throughout the system is of utmost importance. Similarly, but in contrast with rack storage systems, in storage device testing systems, controlling the airflow throughout the system may also be beneficial in view of controlling the heating of the devices in the context of high temperature testing procedures.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIGS. 4A-4B are orthographic views and FIG. 4C is a cross-sectional view illustrating the crossflow air deflector of FIG. 3, according to an embodiment;

DETAILED DESCRIPTION

Figure 1:
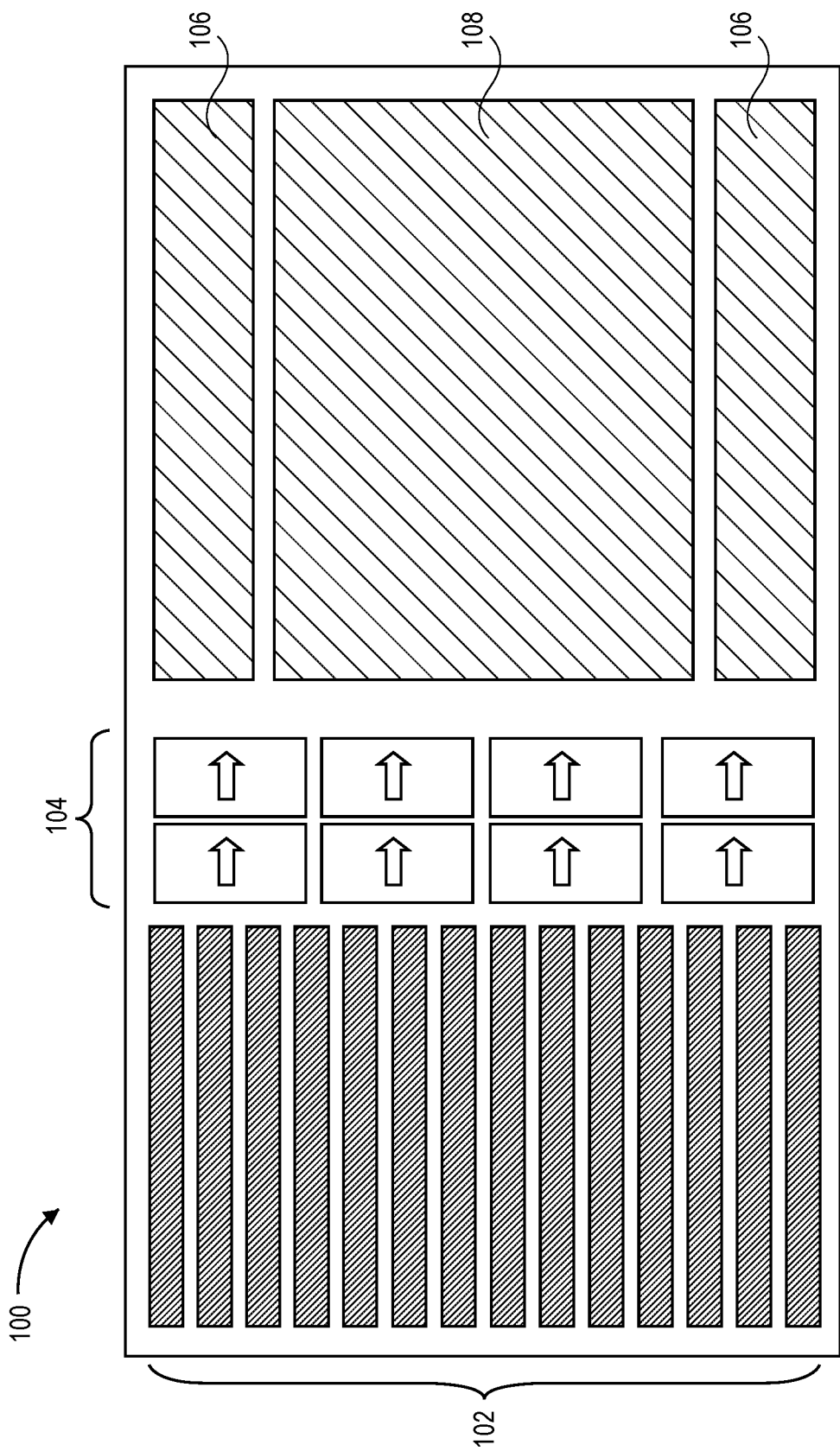
FIG. 1 is a diagram illustrating a conventional high-availability storage server arrangement.

Generally, approaches to managing airflow within an electronics enclosure, such as within a data storage system or storage server, are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices are shown in block diagram form to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Data Storage System Context

Recall that with high-density data storage systems or storage servers, as well as with high density storage device test systems, that utilize forced air convection for cooling, controlling the airflow throughout the system is important. Such systems typically lack independent airflow control for each storage device (generally, each "drive"). To accommodate an individual cooling fan per drive to implement independent airflow control, the slot width would need to be increased undesirably. Specific to the context of test systems, dual-side heating of the devices such as solid-state drives (SSDs) for higher temperature testing is typically not implemented because of space constraints and the use of radial fans, for example, and therefore the temperature and airflow may be less controlled than desired.

FIG. 1 is a diagram illustrating a conventional high-availability storage server arrangement. Storage server 100 comprises a plurality of data storage devices ("DSDs") 102 (e.g., solid-state drives, or "SSDs") for storing digital data, and a plurality of adjacent cooling fans 104 (e.g., radial fans) that operate to cool at least the DSDs 102. A storage server such as storage server 100 may further comprise one or more power supply units ("PSUs") 106 and one or more compute nodes 108, where the PSUs 106 operate to supply power to the powered components constituent to the storage server 100 (e.g., the DSDs 102, compute node 108), and the compute node(s) 108 are typically configured to perform the computational processing, storage/memory (e.g., JBOF, or "Just a Bunch of Flash") management, network/switch fabric, and the like, in the storage server 100. Here, in a high-density storage system 100, the number of DSDs 102 is shown to be greater than the number of fans 104 and, therefore, each DSD 102 is not matched with a corresponding fan 104 providing independent airflow for each DSD 102, i.e., the fans 104 are shared or common. Furthermore, the fans 104 need to be high CFM (cubic feet per minute) to cool high-power SSDs, for example, and need to operate at a relatively high speed even if all DSDs 102 are not operating simultaneously at all times. Thus, these fans 104 typically consume a relatively high amount of power and may be undesirably noisy. Still further, the power requirement of high-power DSDs/SSDs is only expected to increase over time and, therefore, shared (or even independent) radial fans providing relatively low airflow are more likely unable to adequately cool the array of DSDs 102.

Crossflow Air Deflector

In view of the foregoing issues, a storage server having increased DSD drive density, with independent airflow control per drive, may be desirable. Generally, and according to an embodiment, one approach to such a goal involves designing the system architecture arrangement such that the drives are positioned adjacent to one another in a horizontal direction (e.g., vertically positioned in a horizontally adjacent arrangement) and a pair of fans serving a corresponding pair of drives is positioned vertically adjacent to one another, an arrangement that is illustrated and described in more detail elsewhere herein. A facilitating component of such an arrangement is referred to herein as a "crossflow air deflector", which achieves a crossflow of airflows that enter into the storage system horizontal to one another and exit out of the system vertical to one another.

Figure 2:
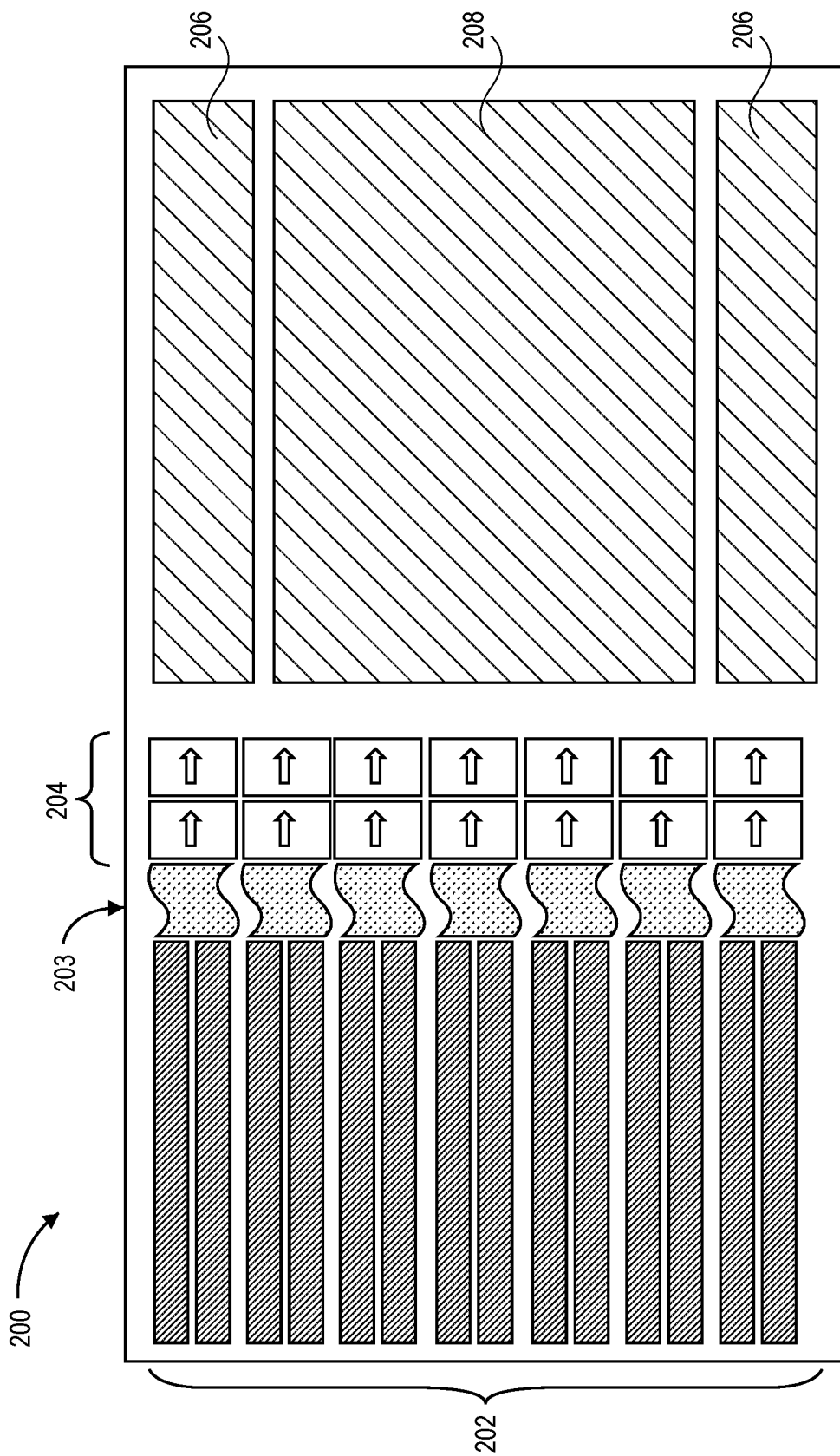
FIG. 2 is a diagram illustrating a storage server arrangement including crossflow air deflectors, according to an embodiment.

FIG. 2 is a diagram illustrating a storage server arrangement including crossflow air deflectors, according to an embodiment. Storage server 200 is configured largely similarly to the storage system 100 of FIG. 1, comprising a plurality of data storage devices ("DSDs") 202 (e.g., solid-state drives, or "SSDs") for storing digital data, a plurality of adjacent cooling fans 204 (e.g., axial fans) that operate to cool at least the DSDs 202. Likewise, a storage server such as storage server 200 may further comprise one or more power supply units ("PSUs") 206 and one or more compute nodes 208. Here, in this high-density storage system 200, the number of fans 204 is equal to the number of DSDs 202 and, therefore, each DSD 202 is matched with a corresponding fan 204 to provide independent airflow for each DSD 202. As discussed, this is facilitated by use of a plurality of crossflow air deflectors 203 (or simply "air deflector 203") positioned between the DSDs 202 and the fans 204, e.g., one air deflector 203 per pair of DSDs 202 and pair of corresponding fans 204 as depicted.

Figure 3:
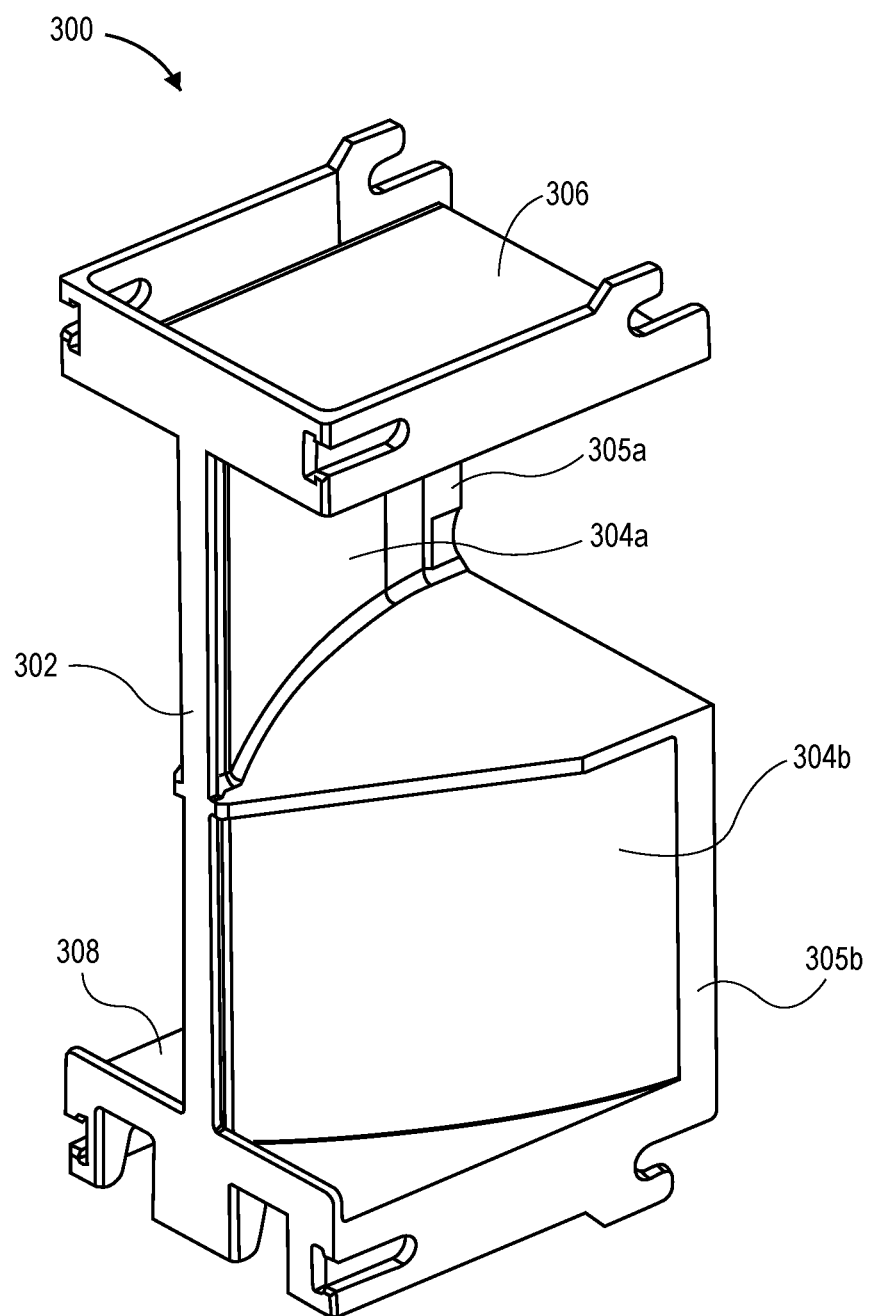
FIG. 3 is a perspective view illustrating a crossflow air deflector, according to an embodiment.
Figure 4C:
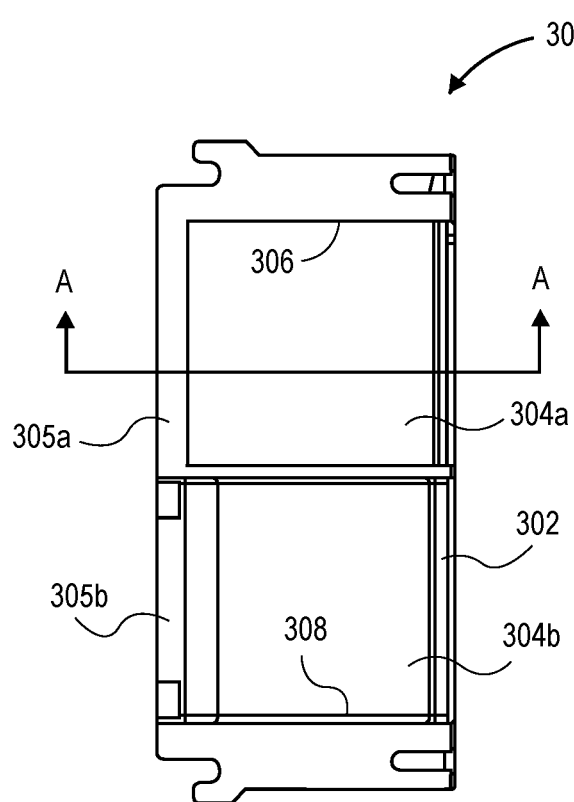
Figure 4C:
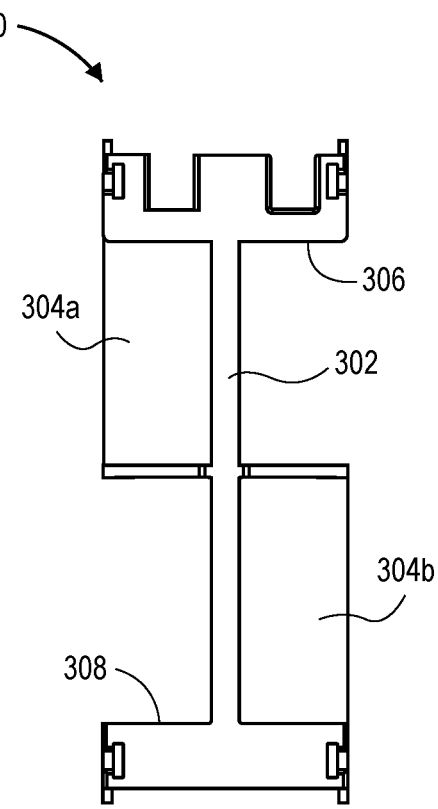
Figure 4C:
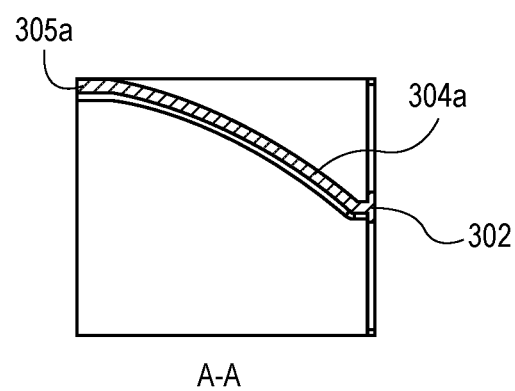

FIG. 3 is a perspective view illustrating a crossflow air deflector, and FIGS. 4A-4B are orthographic views and FIG. 4C is a cross-sectional view (A-A) illustrating the crossflow air deflector of FIG. 3, according to an embodiment. Crossflow air deflector 300 (or simply "air deflector 300") represents an implementation embodiment of the air deflectors 203 of storage system 200 of FIG. 2, configured for directing airflow. For a frame of reference and explanatory purposes and by way of example, the left-facing portion of air deflector 300 of FIG. 3 (and the face viewed in FIG. 4B and right-facing in FIG. 4A) is referred to as proximal, where the opposing right-facing portion of air deflector 300 of FIG. 3 (and the face left-facing in FIG. 4A) is referred to as distal.

According to an embodiment, crossflow air deflector 300 comprises a proximal central spine 302, a first arcuate wall 304a (or "deflection panel") extending from the spine 302 to a first distal lateral edge 305a of the airflow deflector 300, and a second arcuate wall 304b (or "deflection panel") extending from the spine 302 to an opposing second distal lateral edge 305b of the airflow deflector 300. While employing arcuate or curve-shaped walls 304a, 304b augments the directing of the airflow in desired respective crossflow directions, other shapes of walls 304a, 304b or panels may be implemented and still fall within the scope of embodiments. According to an embodiment, airflow deflector 300 further comprises a closeout cover 306, with which the spine 302 and the first arcuate wall 304a are coupled, and a closeout base 308, with which the spine 302 and the second arcuate wall 304b are coupled. As illustrated, the first and second arcuate walls 304a, 304b are configured to direct airflow from a first lateral (e.g., horizontal) position to a lower vertical position and to direct airflow from a second lateral position to an upper vertical position, which is illustrated and described in more detail elsewhere herein such as in reference to FIGS. 5A-5B.

Data Storage Drive Chamber

Figure 5A:
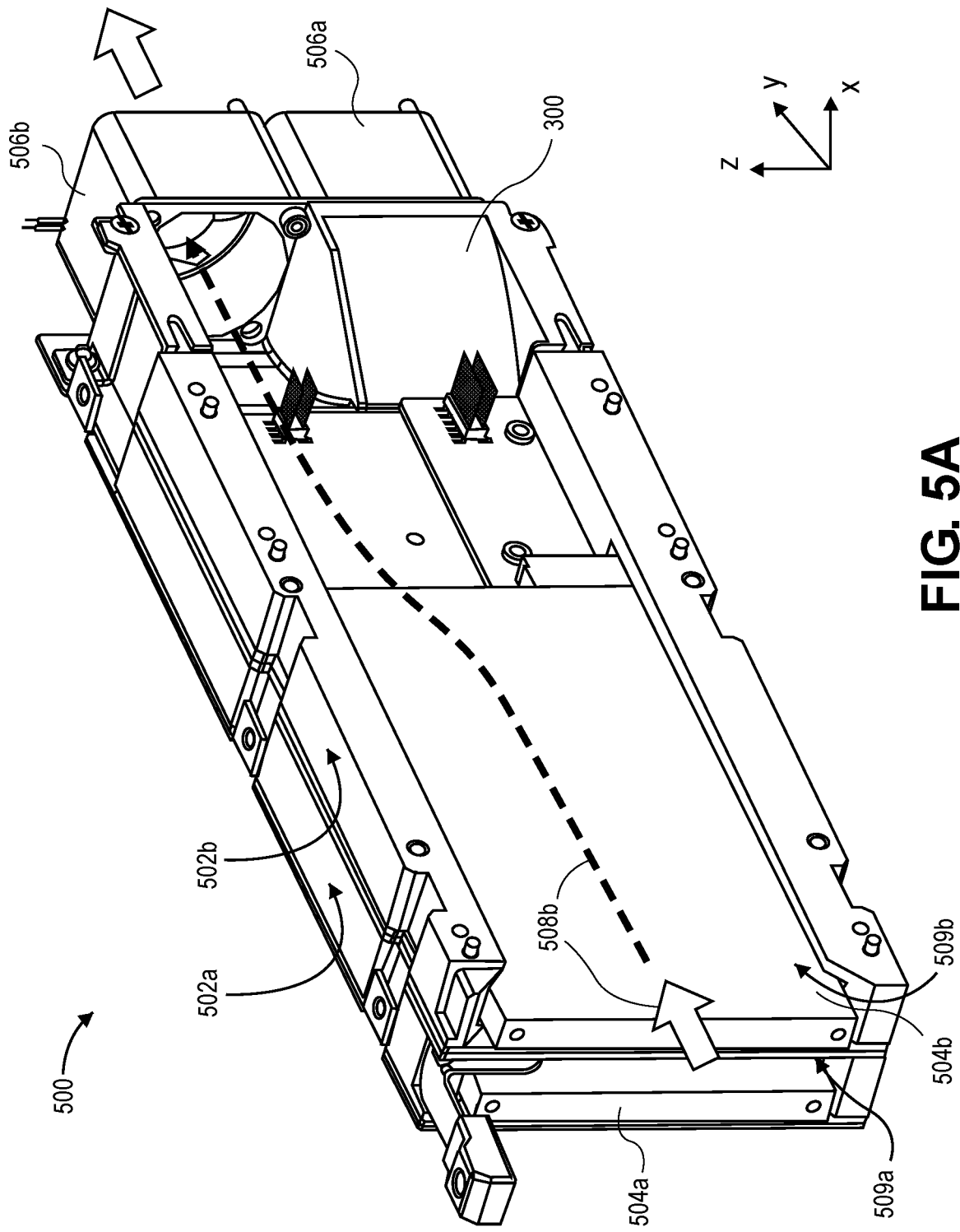
FIG. 5A is a first perspective view illustrating a pair of drive chambers, according to an embodiment.
Figure 5B:
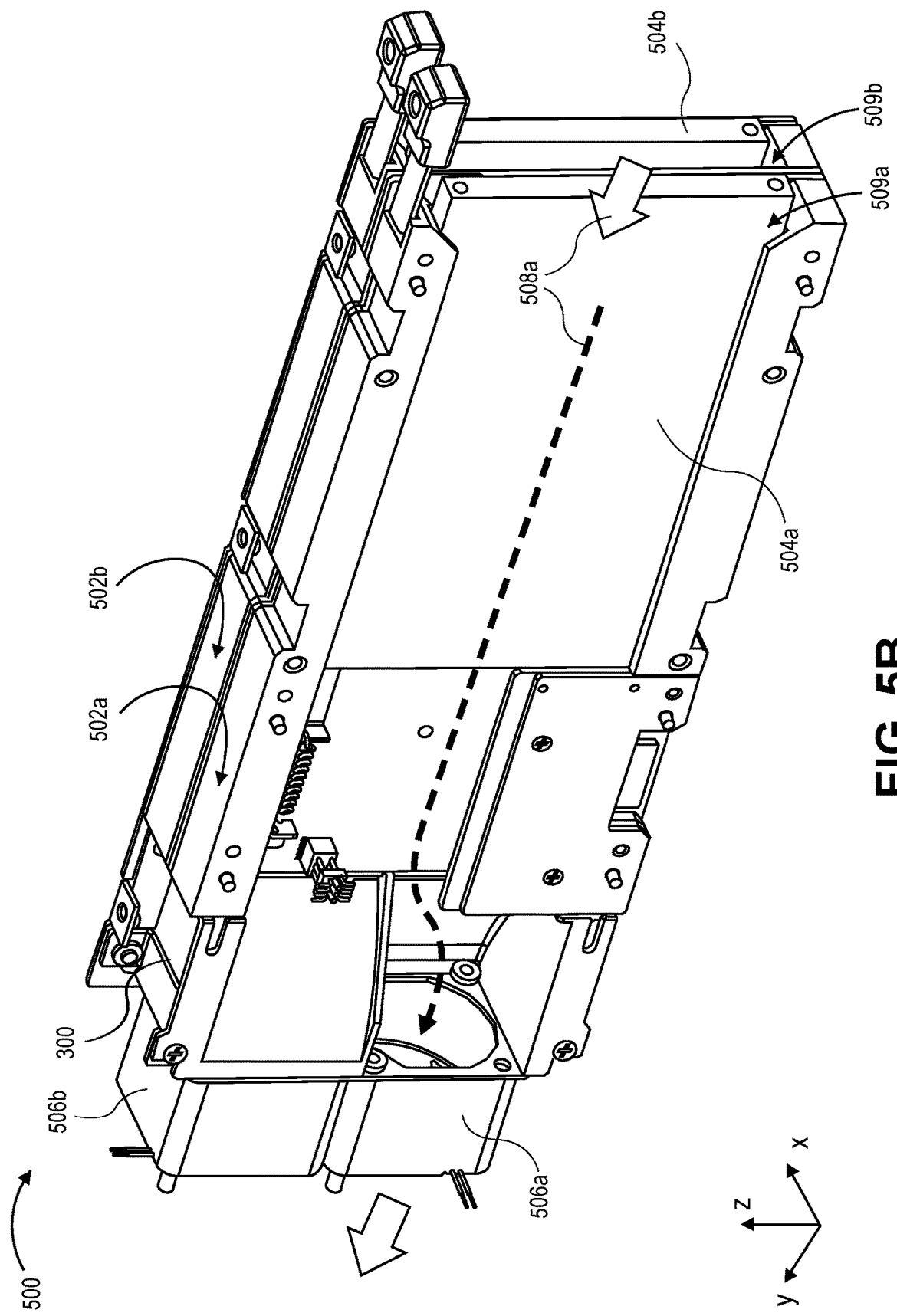
FIG. 5B is a second perspective view illustrating the pair of drive chambers of FIG. 5A, according to an embodiment.

FIG. 5A is a first perspective view illustrating a pair of drive chambers, and FIG. 5B is a second perspective view illustrating the pair of drive chambers of FIG. 5A, according to an embodiment. Stated otherwise, FIGS. 5A-5B illustrate a pair of data storage device chambers, or a chamber assembly, for housing DSDs for any number of purposes, such as for installation into a data storage system or a data storage device test system, and the like. As described hereafter and according to an embodiment, a single chamber may house a single DSD, whereby multiple chambers (two adjacent chambers depicted here) and pairs of chambers may be assembled/installed together (as well as expanded DSD/fan arrays in the lateral and vertical directions, such as 3×3, 4×4, etc. configurations) into one or more racks of a system enclosure to meet particular needs. For a frame of reference and explanatory purposes and by way of example, a coordinate system is illustrated, in which an x-direction is along the width of the chamber and referred to as "lateral", a y-direction is along the length of the chamber from a proximal end to a distal end and referred to as "longitudinal", and a z-direction is along the height of the chamber and referred to as "vertical". However, in practice and according to embodiments a chamber may be positioned in alternative configurations in any given system while operating similarly to as described, but for purposes of explanation the forgoing coordinate system is employed in reference to FIGS. 5A-5B.

In reference to FIG. 5A, drive chamber assembly 500 is depicted in a right-side perspective view, representing a first data storage device (DSD) chamber 502a extending along the longitudinal direction for housing a first DSD 504a (e.g., a SSD, for a non-limiting example), and a second data storage device (DSD) chamber 502b extending along the longitudinal direction adjacent to the first DSD chamber 502a and for housing a second DSD 504b (e.g., a SSD, for a non-limiting example). Chamber assembly 500 further comprises a lower first fan 506a positioned at the distal end of and spanning the lateral width of the chamber assembly 500, an upper second fan 506b positioned at the distal end of and spanning the lateral width of the chamber assembly 500 and above the first fan 506a along the vertical direction, and a crossflow air deflector 300 positioned between a distal end or portion of the first and second DSD chambers 502a, 502b and the first and second fans 506a, 506b.

As depicted in FIGS. 5A-5B and according to an embodiment, the air deflector 300 is configured and positioned to direct airflow 508a (depicted by arrows in FIG. 5B) entering and from the first (left) chamber 502a and flowing along the length of the first DSD 504a into the lower first fan 506a, and to direct airflow 508b (depicted by arrows in FIG. 5A) entering and from the second (right) chamber 502b and flowing along the length of the second DSD 504b into the upper second fan 506b, thereby achieving cross-air flow. According to an embodiment, each DSD chamber 502a, 502b has a lateral width that provides a gap between an inner and/or outer surface or panel of the DSD chamber 502a, 502b (outer panels removed in FIGS. 5A-5B) and its corresponding DSD 504a, 504b, thereby facilitating the respective airflows 508a, 508b along (e.g., the length) of each DSD 504a, 504b. According to an embodiment, air deflector 300 is configured and positioned to direct the respective airflows 508a, 508b in the foregoing manner while also prohibiting or inhibiting the left-side airflow 508a from flowing to and entering the upper second fan 506b and prohibiting or inhibiting the right-side airflow 508b from flowing to and entering the lower first fan 506a. Note that the configuration of the air deflector 300 may be reversed, whereby the air deflector 300 is configured and positioned to direct airflow 508a entering the first (left) chamber 502a and flowing along the length of the first DSD 504a into the upper second fan 506b, and to direct airflow 508b entering the second (right) chamber 502b and flowing along the length of the second DSD 504b into the lower first fan 506a, thereby still achieving desired cross-air flow and independent cooling airflow per drive.

Consequently, each DSD 504a, 504b is effectively cooled independent of the other by way of its corresponding airflow 508a, 508b through the DSD chamber 502a, 502b being directed by the crossflow air deflector 300 to its corresponding individual (e.g., unshared) cooling fan 506a, 506b. Thus, the chamber assembly 500 can effectively be "tuned" according to the individual cooling needs of the respective DSDs 504a, 504b at any given time and/or performance level (e.g., based on temperature sensor feedback), to optimize the amount of power dissipated (e.g., in terms of dissipated heat) based on the amount of heat generated by each respective DSD 504a, 504b. That is, the lower the amount of DSD 504a, 504b power/heat dissipation needed then the lower fan 506a, 506b speed needed and the system power needs can be effectively minimized/optimized and fan noise lessened. Furthermore, high-density storage device systems or storage servers are facilitated by using pairs of vertically stacked, independently functioning cooling fans each matched to a respective DSD (with minimal, negligible, no airflow mixing) to direct airflows incoming from different lateral directions, so high-power DSDs/SSDs can be accommodated without compromising drive density. Further still, more readily-available and higher CFM axial fans may be implemented because, with the use of the air deflector 300, the width of each fan unit can now essentially span the width of a pair of DSD chambers 502a, 502b rather than only spanning the width of a single drive chamber such as is the case with the geometrical/spatial constraints that result in the need to use radial fans in the absence of the air deflector 300. Thus, a wider commercially-available selection of fans (i.e., axial) is available for implementation into the system, while the width of a system that would otherwise employ radial fans is also decreased or at least maintained. According to an embodiment, dual-rotor counter rotating (CR) fans (e.g., two axial fans in series) may be implemented for use as the fans 506a, 506b, such as to mitigate problems associated with a single fan failure which could cause a corresponding drive failure in the case of a single fan configuration.

According to an embodiment, the air deflector 300 of chamber assembly 500 comprises a spine such as the proximal central spine 302 (FIG. 3) extending in the vertical direction and positioned between the first and second chambers 502a, 502b, a first panel such as the first wall 304a (FIG. 3) extending in the longitudinal direction from the spine 302 to a first distal lateral corner such as the first lateral edge 305a (FIG. 3), and a second panel such as the second wall 304b (FIG. 3) extending in the longitudinal direction from the spine 302 to a second distal lateral corner such as the second lateral edge 305b (FIG. 3).

Data Storage Device Test System

As discussed, with high density storage device test systems that utilize forced air convection for cooling, controlling the airflow throughout the system is important, and such test systems typically lack independent airflow control for each storage device (generally, each "drive"). As with storage servers discussed elsewhere herein, to accommodate an individual cooling fan per drive to implement independent airflow control, the slot width would need to be increased undesirably. Furthermore, and specific to the context of test systems, dual-side heating of the devices such as solid-state drives (SSDs) for higher temperature testing is typically not employed because of space constraints and therefore the temperature and airflow may be less controlled than desired.

Figure 6:
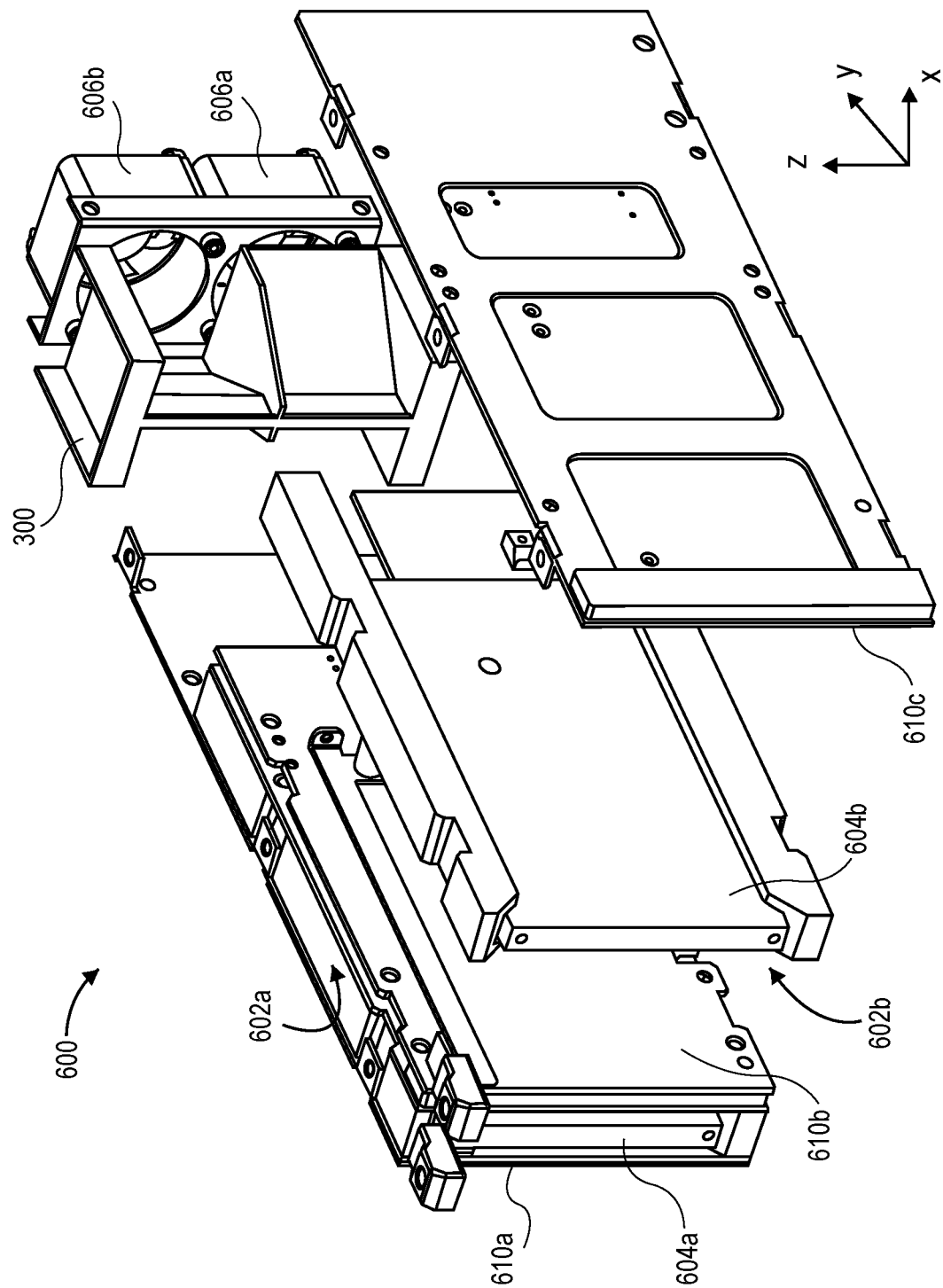
FIG. 6 is an exploded view of a drive testing unit, according to an embodiment.

FIG. 6 is an exploded view of a drive testing unit, according to an embodiment. Stated otherwise, FIG. 6 illustrates a pair of data storage device chambers, or a chamber assembly, for housing DSDs for installation into a data storage device test system. As described hereafter and according to an embodiment, a single chamber may house a single DSD, whereby multiple chambers (two adjacent chambers depicted here) and pairs of chambers may be assembled/installed together (as well as expanded DSD/fan arrays in the lateral and vertical directions, such as 3×3, 4×4, etc. configurations) into one or more racks of a system enclosure to meet particular needs. For a frame of reference and explanatory purposes and by way of example, the coordinate system described in reference to the DSD chamber assembly 500 of FIGS. 5A-5B is likewise applicable here.

Similar to the DSD chamber 500 of FIG. 5A, drive test chamber assembly 600 is depicted in a right-side perspective view, representing a first data storage device (DSD) chamber 602a extending along the longitudinal direction for housing a first DSD 604a (e.g., a SSD, for a non-limiting example), and a second data storage device (DSD) chamber 602b extending along the longitudinal direction adjacent to the first DSD chamber 602a and for housing a second DSD 604b (e.g., a SSD, for a non-limiting example). Drive test chamber assembly 600 further comprises a lower first fan 606a positioned at the distal end of and spanning the lateral width of the drive test chamber assembly 600, an upper second fan 606b positioned at the distal end of and spanning the lateral width of the drive test chamber assembly 600 and above the first fan 606a along the vertical direction, and a crossflow air deflector 300 positioned between a distal end or portion of the first and second DSD chambers 602a, 602b and the first and second fans 606a, 606b.

Similar to the DSD chamber 500 of FIGS. 5A-5B and according to an embodiment, the air deflector 300 is configured and positioned to direct airflow entering and from the first (left) chamber 602a and flowing along the length of the first DSD 604a into the lower first fan 606a, and to direct airflow entering and from the second (right) chamber 602b and flowing along the length of the second DSD 604b into the upper second fan 606b, thereby achieving cross-air flow. According to an embodiment, air deflector 300 is configured and positioned to direct the respective airflows in the foregoing manner while also prohibiting or inhibiting the left-side airflow from flowing to and entering the upper second fan 606b and prohibiting or inhibiting the right-side airflow from flowing to and entering the lower first fan 606a. Likewise, the configuration of the air deflector 300 may be reversed, whereby the air deflector 300 is configured and positioned to direct airflow entering the first (left) chamber 602a and flowing along the length of the first DSD 604a into the lower first fan 606a, and to direct airflow entering the second (right) chamber 602b and flowing along the length of the second DSD 604b into the upper second fan 606b, thereby still achieving desired cross-air flow and independent airflow per drive.

According to an embodiment, drive test chamber assembly 600 further comprises means for heating 610b, such as a heater-embedded printed circuit board (PCB), positioned between the first DSD chamber 602a and the second DSD chamber 602b. According to an embodiment, drive test chamber assembly 600 comprises first means for heating 610a (a heater-embedded PCB according to an embodiment) positioned adjacent to the first DSD chamber 602a, and a second means for heating 610c (a heater-embedded PCB according to an embodiment) positioned adjacent to the second DSD chamber 602b. Thus, surface temperature control and management for each DSD 604a, 604b, including the management of applied heat from the heating means for high-temperature testing purposes, is effectively independent of the other by way of its corresponding airflow through the DSD chamber 602a, 602b being directed by the crossflow air deflector 300 to its corresponding individual (e.g., unshared) temperature control fan 606a, 606b. Similar to the DSD chamber 500 of FIGS. 5A-5B, the drive test chamber assembly 600 can be utilized for individualized temperature control and management (e.g., heating) according to individual testing goals for each of the respective DSDs 604a, 604b. For example, the individual DSDs can be tested at different temperatures in a common drive testing system during testing.

Method for Controlling Airflow in a Data Storage Device Assembly

Figure 7:
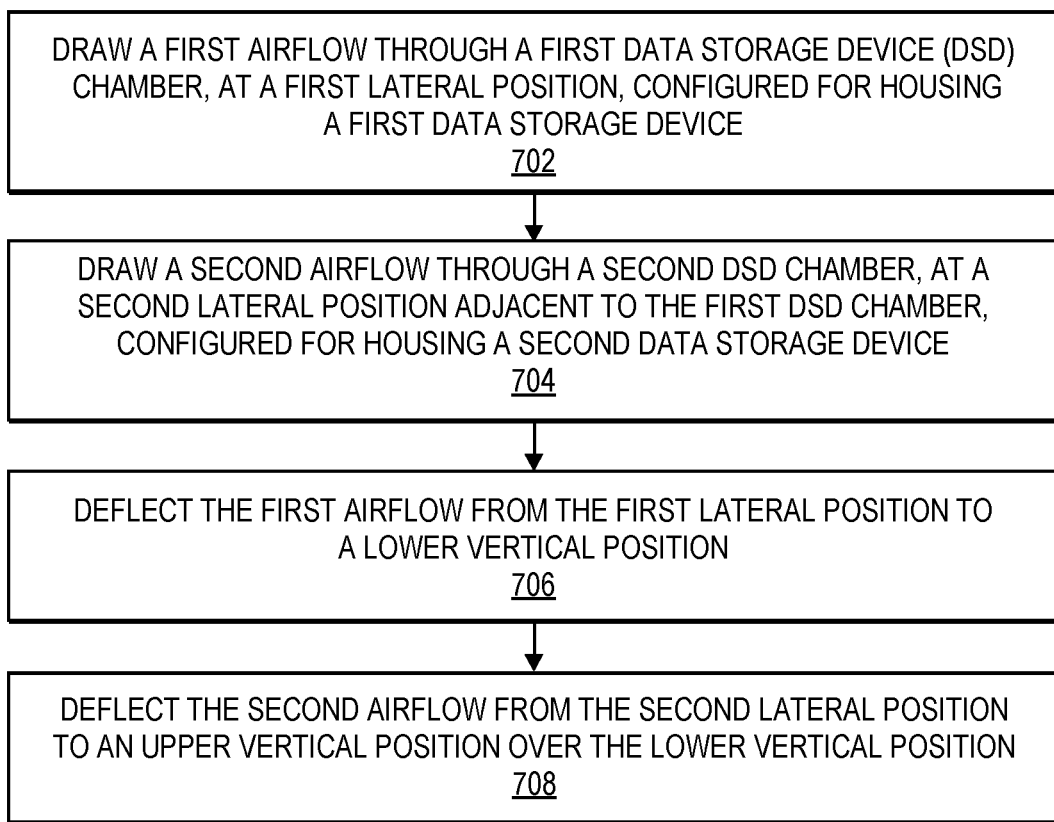
FIG. 7 is a flow diagram illustrating a method for controlling airflow in a data storage device assembly, according to an embodiment.

FIG. 7 is a flow diagram illustrating a method for controlling airflow in a data storage device assembly, according to an embodiment. The method of FIG. 7 may be implemented in conjunction with each of the systems described in reference to FIGS. 5A-5B and in reference to FIG. 6, according to respective embodiments.

At block 702, a first airflow is drawn through a first data storage device (DSD) chamber, at a first lateral position, configured for housing a first DSD. For example, airflow 508a (FIG. 5B) is drawn, directed, pulled, sucked through the first DSD chamber 502a (FIG. 5B) configured for housing the first DSD 504a (FIG. 5B), at or along the left-hand side of the chamber assembly 500 (FIGS. 5A-5B). According to an embodiment, drawing the first airflow includes drawing the first airflow (e.g., airflow 508a) across an outer surface of the first DSD (e.g., first DSD 504a), such as for cooling purposes. According to an embodiment, drawing the first airflow includes drawing the first airflow (e.g., airflow 508a) across a first heater (e.g., first means for heating 610a) corresponding to the first DSD (e.g., first DSD 504a), such as for heating purposes.

At block 704, a second airflow is drawn through a second data storage device (DSD) chamber, at a second lateral position adjacent to the first DSD chamber, configured for housing a second DSD. For example, airflow 508b (FIG. 5A) is drawn, directed, pulled, sucked through the second DSD chamber 502b (FIG. 5A) configured for housing the second DSD 504b (FIG. 5A), at or along the right-hand side of the chamber assembly 500. According to an embodiment, drawing the second airflow includes drawing the second airflow (e.g., airflow 508b) across an outer surface of the second DSD (e.g., second DSD 504b), such as for cooling purposes. According to an embodiment, drawing the second airflow includes drawing the second airflow (e.g., airflow 508b) across a second heater (e.g., second means for heating 610c) corresponding to the second DSD (e.g., first DSD 504b), such as for heating purposes.

At block 706, the first airflow is deflected from the first lateral position to a lower vertical position. For example, airflow 508a is deflected by crossflow air deflector 300 (FIGS. 3-6) from the left-hand side of the chamber assembly 500 to the lower vertical position of the first fan 506a (FIGS. 5A-5B).

At block 708, the second airflow is deflected from the second lateral position to an upper vertical position over the lower vertical position. For example, airflow 508b is deflected by crossflow air deflector 300 from the right-hand side of the chamber assembly 500 to the upper vertical position of the second fan 506b (FIGS. 5A-5B).

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A crossflow air deflector for directing airflow, the air deflector comprising:
    a proximal central spine;
    a first arcuate wall extending from the spine to a first distal lateral edge of the airflow deflector; and
    a second arcuate wall extending from the spine to a second distal lateral edge of the airflow deflector opposing the first distal lateral edge.

2. The crossflow air deflector of claim 1, further comprising:
    a closeout cover with which the spine and the first arcuate wall are coupled; and
    a closeout base with which the spine and the second arcuate wall are coupled.

3. The crossflow air deflector of claim 1, wherein the first and second arcuate walls are configured to direct airflow from a first lateral position to a lower vertical position and to direct airflow from a second lateral position to an upper vertical position.

4. A data storage device (DSD) chamber assembly comprising the crossflow air deflector of claim 1.

5. A data storage system comprising the DSD chamber assembly of claim 4.

6. A data storage device test system comprising the DSD chamber assembly of claim 4.

7. A crossflow air deflector for directing airflow, the air deflector comprising:
    a proximal central spine extending in a vertical direction;
    a first panel extending in a longitudinal and a lateral directions from the spine to a first distal vertical edge; and
    a second panel extending in the longitudinal and the lateral directions from the spine to a second distal vertical edge vertically opposing the first distal vertical edge in a lateral plane.

8. The crossflow air deflector of claim 7, further comprising:
    a closeout cover with which the spine and the first panel are coupled; and
    a closeout base with which the spine and the second panel are coupled.

9. The crossflow air deflector of claim 7, wherein the first and second panels are configured to direct airflow from a first lateral position to a lower vertical position and to direct airflow from a second lateral position to an upper vertical position.

10. A data storage device (DSD) chamber assembly comprising the crossflow air deflector of claim 7.

11. A data storage system comprising the DSD chamber assembly of claim 10.

12. A data storage device test system comprising the DSD chamber assembly of claim 10.

13. The crossflow air deflector of claim 7, wherein at least one of the first and second panels is configured as a non-planar structure.

* * * * *